(12) United States Patent
Takayama et al.

(10) Patent No.: US 8,546,828 B2
(45) Date of Patent: Oct. 1, 2013

(54) SEMICONDUCTOR LIGHT EMITTING DEVICE HAVING HEAT DISSIPATING VIAS

(75) Inventors: Hiroyuki Takayama, Tokyo (JP); Maiko Tanabe, Tokyo (JP); Kaori Namioka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/108,327

(22) Filed: May 16, 2011

(65) Prior Publication Data
US 2011/0284897 A1    Nov. 24, 2011

(30) Foreign Application Priority Data

May 18, 2010    (JP) .................................. 2010-114319

(51) Int. Cl.
*H01L 33/00*    (2010.01)
*H01L 27/15*    (2006.01)
*H01L 29/267*   (2006.01)
*H01L 31/12*    (2006.01)
*F21V 29/00*    (2006.01)
*C03B 29/00*    (2006.01)

(52) U.S. Cl.
USPC .......... 257/98; 257/81; 257/99; 257/E33.056; 257/E33.076; 257/E33.06; 362/294; 156/89.12

(58) Field of Classification Search
None
See application file for complete search history.

(56) References Cited

U.S. PATENT DOCUMENTS

| | | | |
|---|---|---|---|
| 2008/0062701 A1* | 3/2008 | Harrah et al. | 362/296 |
| 2008/0308311 A1* | 12/2008 | Kodama et al. | 174/260 |
| 2009/0090926 A1* | 4/2009 | Wang et al. | 257/99 |
| 2009/0315057 A1* | 12/2009 | Konishi et al. | 257/98 |
| 2011/0001162 A1* | 1/2011 | Nakayama et al. | 257/99 |
| 2011/0261536 A1* | 10/2011 | Feichtinger et al. | 361/713 |

FOREIGN PATENT DOCUMENTS

| JP | 2008-172113 A | 7/2008 |
|---|---|---|
| JP | 2010-034487 A | 2/2010 |

* cited by examiner

*Primary Examiner* — Michael Jung
(74) *Attorney, Agent, or Firm* — Holtz, Holtz, Goodman & Chick, PC

(57) ABSTRACT

The device includes a first ceramic layer; a second ceramic layer on the first ceramic layer and having a light emitting element mounting area; a reflective layer so formed on a surface of the second ceramic layer that the reflective layer covers at least the mounting area; a protective layer which covers the reflective layer; a semiconductor light emitting element mounted on the protective layer positioned above the element mounting area; and at least one heat dissipation via passing through the first ceramic layer. The heat dissipation via is disposed in a position that does not overlap with the element mounting area in a direction in which the ceramic layers are stacked.

7 Claims, 9 Drawing Sheets

SEMICONDUCTOR LIGHT EMITTING DEVICE HAVING HEAT DISSIPATING VIAS

BACKGROUND OF THE INVENTION

1. Technical Field

The present invention relates to a semiconductor light emitting device having a light emitting diode (LED) or any other semiconductor light emitting element mounted on a wiring substrate.

2. Description of the Related Art

A semiconductor light emitting device having an LED mounted on a wiring substrate has been used in an illuminator or lighting fixture, a backlight, an industrial apparatus, and other apparatus. In recent years, since the amount of heat generated in a semiconductor light emitting device itself increases as the intensity of the light from the semiconductor light emitting device increases, there is an increasing necessity to quickly dissipate the heat generated in the semiconductor light emitting device.

To increase heat dissipation performance, there has been a known technique for forming a wiring substrate or wiring board on which an LED is mounted with a plurality of ceramic layers and providing heat dissipation vias through the wiring substrate formed of the plurality of ceramic layers. The thus configured wiring substrate can dissipate a larger amount of heat because the heat dissipation vias are made of silver or copper having heat conductivity higher than that of the ceramic of which the wiring substrate is made. Japanese Patent Application Laid-Open Publication No. 2008-172113 (hereinafter also referred to as Patent Document 1), for example, describes a wiring substrate based on the technique described above.

Since silver used for the heat dissipation vias is suitable for a material that reflects light emitted from an LED (that is, having high reflectance), a technique for providing a reflective layer made of silver on a surface of a wiring substrate has also been known. On the other hand, since silver readily reacts with sulfur, silver sulfide tends to be produced in the portion of the wiring substrate that is exposed to the atmosphere. Since the reflectance of silver sulfide is lower than that of silver, the intensity of the light from the semiconductor light emitting device disadvantageously decreases with time. Further, the chromaticity of the light and external appearance of the semiconductor light emitting device change with time when the silver is sulfurized. Further, when the reflective layer made of silver is irradiated with the light emitted from the LED, part of the silver in the reflective layer is activated and diffused in a light transmissive resin, resulting in a problem similar to that occurs due to the sulfurization of silver described above.

To solve the problems described above, there has been a known technique for coating or covering the reflective layer with a light transmissive material to prevent the silver from being sulfurized and the activated silver from floating in the light transmissive resin. Japanese Patent Application Laid-Open No. 2010-34487 (hereinafter also referred to as Patent Document 2), for example, describes a wiring substrate based on the technique described above. In the wiring substrate described in Patent Document 2, a reflective layer made of silver is coated with a glass layer.

SUMMARY OF THE INVENTION

A wiring substrate formed of a ceramic laminate, however, has another problem of irregularities on the front and rear surfaces resulting from heat dissipation vias. When a reflective layer and a glass layer with which the reflective layer is coated are formed on the portions of the wiring substrate where the heat dissipation vias are exposed to the atmosphere, the irregularities resulting from the heat dissipation vias are emphasized by the glass layer. In other words, irregularities larger than those resulting from the heat dissipation vias are produced on the surface of the glass layer. When an LED is mounted on the glass layer with such large irregularities, the die-bonding strength of the LED disadvantageously decreases. Further, the optical axis of the LED is shifted, and desired intensity or chromaticity cannot be provided. Moreover, in a multi-chip-type semiconductor light emitting device in which a plurality of LEDs are mounted, such large irregularities produced on the surface of the glass layer disadvantageously cause the optical axes of the LEDs vary from one another. Further, when the LEDs emit light of different colors, the color balance of the emitted light as a whole is disadvantageously degraded.

The invention has been made in view of the problems described above. An object of the invention is to provide a semiconductor light emitting device having high heat dissipation performance, large die-bonding strength of a portion where an LED is mounted, and a small amount of shift of the optical axis of the LED.

To achieve the object described above, there is provided a semiconductor light emitting device, which includes a first ceramic layer; a second ceramic layer stacked on the first ceramic layer and having an element mounting area on which the semiconductor light emitting element is mounted; a reflective layer so formed on a surface of the second ceramic layer that the reflective layer covers at least the element mounting area; a protective layer which covers the reflective layer; a semiconductor light emitting element mounted on the protective layer positioned above the element mounting area; and at least one heat dissipation via passing through the first ceramic layer. The heat dissipation via is disposed in a position that does not overlap with the element mounting area in a direction in which the first and second ceramic layers are stacked.

In the semiconductor light emitting device according to the invention, providing the heat dissipation via(s) passing through only the first ceramic layer and stacking the second ceramic layer on the first ceramic layer can prevent irregularities produced on the front surface of the first ceramic layer resulting from the formation of the heat dissipation vias from affecting the element mounting surface of the second ceramic layer. Since the heat dissipation via(s) does not overlap with the element mounting area of the second ceramic layer in the direction in which the first and second ceramic layers are stacked, the degree of influence of the irregularities on the element mounting surface can be further reduced. Moreover, providing the heat dissipation via(s) in a position(s) other than the portion immediately below the semiconductor light emitting element allows the second ceramic layer to be thinner, whereby the heat dissipation performance of the semiconductor light emitting device can be improved.

Further, reducing the magnitude of the irregularities described above can prevent the die-bonding strength of the semiconductor light emitting element from decreasing and the optical axis of the semiconductor light emitting element from shifting.

DESCRIPTION OF THE PREFERRED EMBODIMENTS

Embodiments of the invention will be described below in detail with reference to the accompanying drawings.

First Embodiment

Figure 1A:
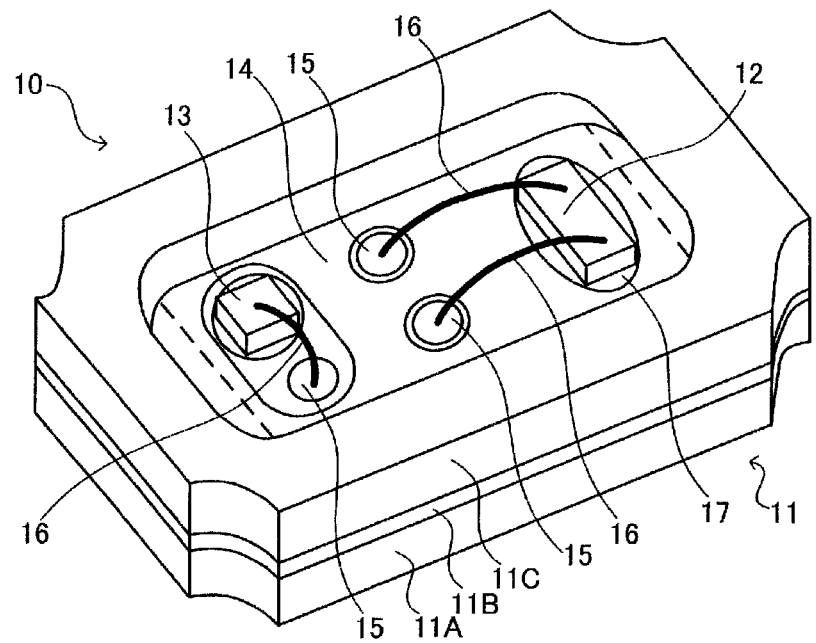
FIG. 1A is a perspective view showing a semiconductor light emitting device according to a first embodiment of the invention.
Figure 1B:
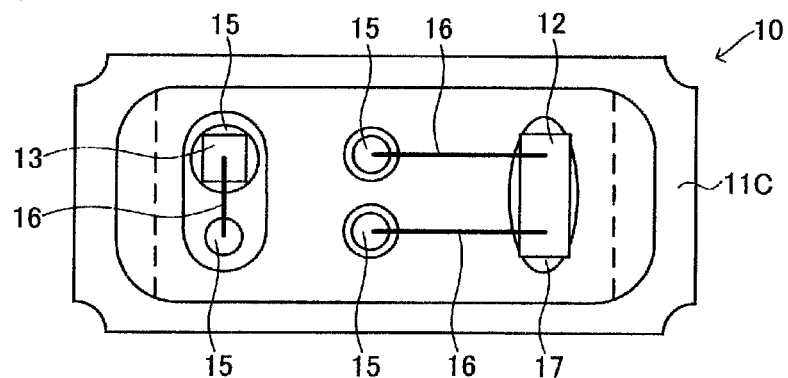
FIG. 1B is a plan view showing the semiconductor light emitting device according to the first embodiment of the invention.
Figure 1C:
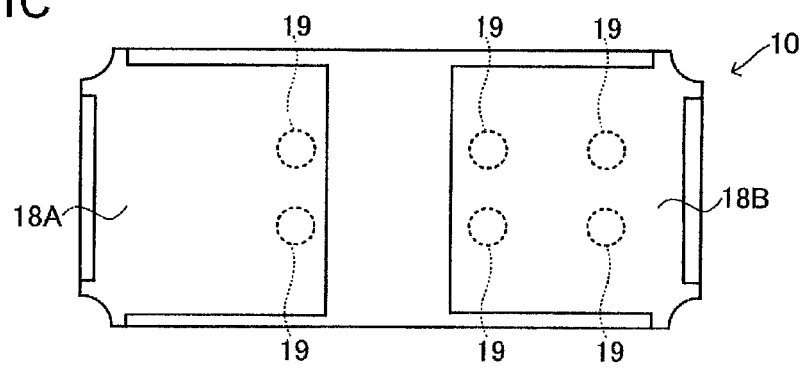
FIG. 1C is a bottom view showing the semiconductor light emitting device according to the first embodiment of the invention.
Figure 2A:
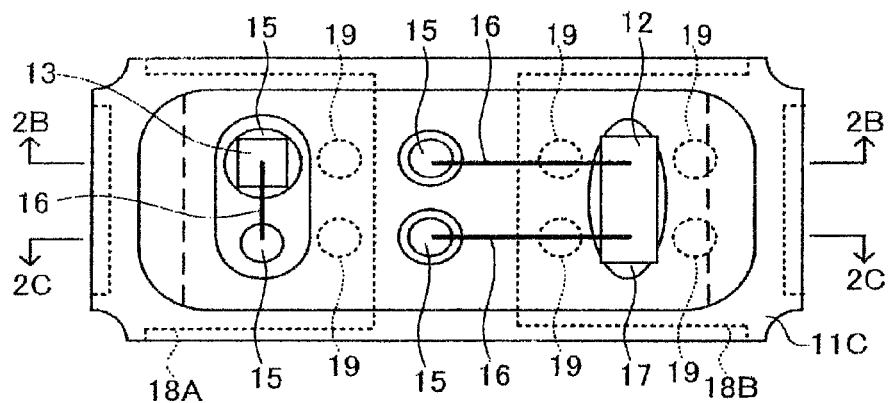
FIG. 2A is a schematic plan view illustrating the positions of heat dissipation vias in the semiconductor light emitting device according to the first embodiment.
Figure 2B:
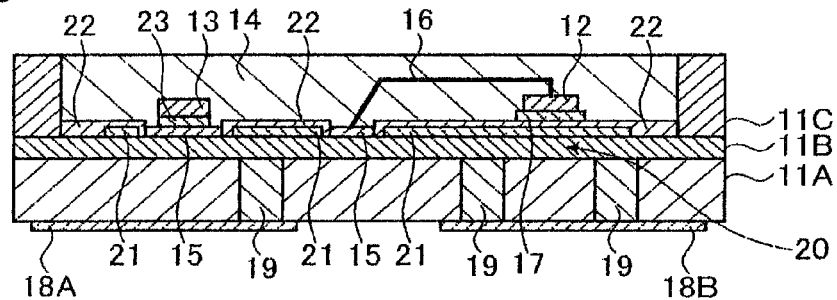
FIG. 2B is a cross-sectional view taken along the line 2B-2B in FIG. 2A.
Figure 2C:
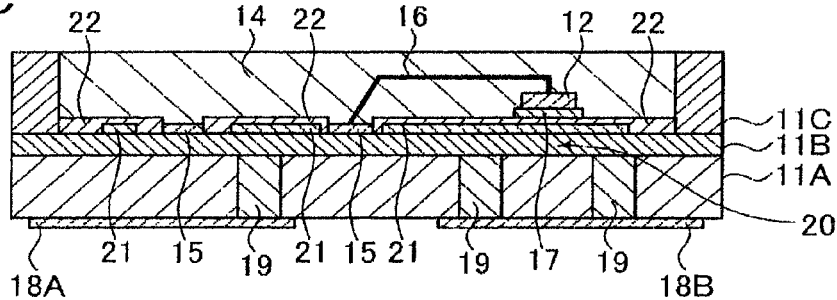
FIG. 2C is a cross-sectional view taken along the line 2C-2C in FIG. 2A.
Figure 2D:
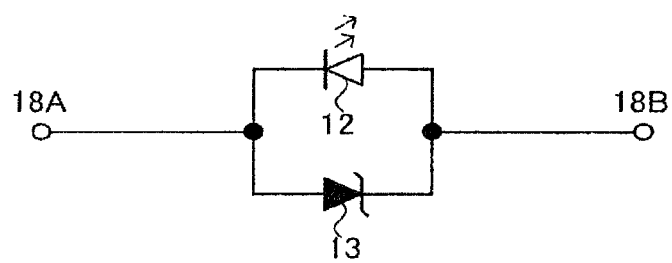
FIG. 2D is an equivalent circuit diagram of the semiconductor light emitting device according to the first embodiment of the invention.

The structure of a semiconductor light emitting device according to a first embodiment of the invention will first be described with reference to FIGS. 1A to 1C and 2A to 2D. FIG. 1A is a perspective view of the semiconductor light emitting device according to the first embodiment of the invention. FIG. 1B is a plan view of the semiconductor light emitting device. FIG. 1C is a bottom view of the semiconductor light emitting device. FIG. 2A is a schematic plan view showing the positions of heat dissipation vias in the semiconductor light emitting device according to the first embodiment. FIG. 2B is a cross-sectional view taken along the line 2B-2B in FIG. 2A. FIG. 2C is a cross-sectional view taken along the line 2C-2C in FIG. 2A. FIG. 2D is an equivalent circuit diagram of the semiconductor light emitting device according to the first embodiment.

A semiconductor light emitting device 10 includes a wiring substrate 11 having a substantially rectangular shape in the plan view, a light emitting diode (LED) 12 and a protection element 13 mounted on the wiring substrate 11, and a light transmissive resin 14 that covers the LED 12 and the protection element 13, as shown in FIGS. 1A and 1B. The LED 12 has a substantially rectangular shape in the plan view, and the protection element 13 has a substantially square shape.

The wiring substrate 11 is made of a low temperature co-fired ceramic (LTCC) containing $Al_2O_3$ as a major or primary component. Specifically, the wiring substrate 11 includes a first ceramic layer 11A that serves as a support body, a second ceramic layer 11B provided on the first ceramic layer 11A and having an element mounting area, and a third ceramic layer 11C provided on the second ceramic layer 11B and functioning as not only a reflector that reflects light from the LED 12 but also a sidewall that prevents the light transmissive resin 14 from leaking. The second ceramic layer 11B is thinner than the first ceramic layer 11A.

Four wiring pads 15 are formed on the front surface of the second ceramic layer 11B. Each of the wiring pads 15 is a metallic pad made of AgPd, Ni, and Au stacked in this order (AgPd/Ni/Au). Of three of the wiring pads 15, one is connected to a P-side electrode of the LED 12, one is connected to an N-side electrode of the LED 12, and the other is connected to a P-side electrode of the protection element 13 via bonding wires 16. On the wiring pad 15 that is not connected to the LED 12 or the P-side electrode of the protection element 13 is mounted the protection element 13 with a conductive adhesive therebetween. In other words, an N-side electrode of the protection element 13 is electrically connected to that wiring pad 15 with a conductive adhesive therebetween. The LED 12 is fixedly attached to the front surface of the second ceramic layer 11B via a silicone resin adhesive 17. In the present embodiment, the area of the second ceramic layer 11B to which the LED 12 is fixedly attached is called an element mounting area 20. The silicone resin adhesive 17 has a thickness ranging from 10 to 30 μm (approximately 20 μm, for example).

The third ceramic layer 11C has a substantially rectangular through hole formed therethrough, and the LED 12, the protection element 13, the wiring pads 15, and the bonding wires 16 are disposed over the front surface of the second ceramic layer 11B that is exposed through the through hole of the third ceramic layer 11C. Further, the light transmissive resin 14 is so provided on the front surface of the second ceramic layer 11B that the LED 12, the protection element 13, the wiring pads 15, and the bonding wires 16 are covered and the through hole is filled.

External connection terminals 18A and 18B are formed on the rear surface of the first ceramic layer 11A, as shown in FIG. 1C. Each of the external connection terminals 18A and 18B is a metallic terminal made of AgPd, Ni, and Au stacked in this order (AgPd/Ni/Au). Further, a plurality of heat dissipation vias 19 extending in the thickness direction of the first ceramic layer 11A are formed in the areas where the external connection terminals 18A and 18B are formed. In a top view (i.e., when viewed from the direction normal to the ceramic layers; FIG. 2A), some of the heat dissipation vias 19 are disposed on the positions sandwiching the area where the LED 12 is mounted. Stated another way, the heat dissipation vias 19 are disposed so as to sandwich a corresponding portion of the ceramic layer 11A immediately below the LED mounting area. Or, the heat dissipation vias 19 can be disposed so as to surround a corresponding portion of the ceramic layer 11A immediately below the LED mounting area. In a similar manner, the other heat dissipation vias 19 are formed in the vicinity and outside of a corresponding portion of the ceramic layer 11A immediately below the area where the protection element 13 is mounted in the top view (FIG. 2A). That is, the heat dissipation vias 19 are formed in positions shifted from or outside of the portions immediately below the areas where the LED 12 and the protection element 13 are mounted.

The heat dissipation vias 19, each of which has a substantially cylindrical shape, are provided in the first ceramic layer 11A, as shown in FIGS. 2B and 2C. In other words, the heat dissipation vias 19 do not pass through the second ceramic layer 11B. One end of each of the heat dissipation vias 19 is connected to the external connection terminal 18A or 18B. The heat dissipation vias 19, which are made of AgPd, are superior in heat dissipation capability to the first ceramic layer 11A, which is made of $Al_2O_3$ as a major component. A reflective layer 21 and a glass layer 22 as well as the wiring pads 15 are formed on the front surface of the second ceramic layer 11B. The reflective layer 21, which is made of Ag, reflects the light emitted from the LED 12 toward a light extracting plane. The reflective layer 21 has a thickness ranging from approximately 5 to 15 µm. The reflective layer 21 is desirably formed substantially all over the front surface of the second ceramic layer 11B but should not be in contact with the wiring pads 15. The glass layer 22 covers the upper and side surfaces of the reflective layer 21 so that the reflective layer 21 is not exposed to the atmosphere and serves as a protective layer that prevents the reflective layer 21 made of Ag from being sulfurized. The glass layer 22 has a thickness ranging from 15 to 25 µm (approximately 20 µm, for example). The reflective layer 21 and the glass layer 22 that is a protective layer, are formed at least on the element mounting area 20 of the second ceramic layer 11B, and the LED 12 is disposed on the element mounting area 20 via the reflective layer 21, the glass layer 22, and the silicone resin adhesive 17.

The protection element 13 is fixedly attached to the corresponding wiring pad 15 with a conductive adhesive 23. The wiring pad 15 electrically connected to the protection element 13 via the conductive adhesive 23 is connected to the external connection terminal 18B via an internal wiring line formed in the first ceramic layer 11A and the second ceramic layer 11B. The wiring pads 15 electrically connected to the P-side and N-side electrodes of the LED 12 via bonding wires 16 are connected to the external connection terminals 18A and 18B, respectively, via internal wiring lines formed in the first ceramic layer 11A and the second ceramic layer 11B. The wiring pad 15 electrically connected to the P-side electrode of the protection element 13 via a bonding wires 16 is connected to the external connection terminal 18A via an internal wiring line formed in the first ceramic layer 11A and the second ceramic layer 11B.

The protection element 13 is connected in parallel with the LED 12, as shown in FIG. 2D. The circuit configuration allows the protection element 13 to absorb any surge voltage applied between the external connection terminals 18A and 18B and hence prevents the LED 12 from being destroyed or degraded.

A description will next be made of an advantageous effect of the semiconductor light emitting device 10 and the wiring substrate 11 according to the first embodiment. In the wiring substrate 11 according to the first embodiment, since the reflective layer 21 made of Ag is formed on the front surface of the second ceramic layer 11B, the light emitted from the LED 12 can be directed toward the light extracting plane or extracting direction, whereby the intensity of the light from the semiconductor light emitting device 10 can be increased. Further, covering the reflective layer 21 with the glass layer 22 prevents the Ag of which the reflective layer 21 is made from being sulfurized and the Ag from diffusing into the light transmissive resin 14. It is therefore possible to prevent the intensity of the light from the semiconductor light emitting device 10 from decreasing with time due to degradation of the reflective layer 21.

Further, in the wiring substrate 11 according to the first embodiment, the heat generated in association with light emission in the LED 12 can be efficiently dissipated out of the semiconductor light emitting device 10, since a plurality of heat dissipation vias 19 are buried in the first ceramic layer 11A in the vicinity of the area on which the LED 12 is mounted.

Further, in the wiring substrate 11 according to the first embodiment, the degree of influence of the irregularities resulting from the formation of the heat dissipation vias 19 on the glass layer 22 can be reduced, since the reflective layer 21 and the glass layer 22 are formed via the second ceramic layer 11B above the first ceramic layer 11A, in which the heat dissipation vias 19 are buried. More specifically, since the interposed second ceramic layer 11B reduces the magnitude of the irregularities on the front surface of the glass layer 22 and hence the element mounting surface remains flat, whereby the die-bonding strength of the LED 12 will not be decreased. Further, since the heat dissipation vias 19 are so provided that they do not overlap with the area on which the LED 12 is mounted in the direction in which the layers of the wiring substrate 11 are stacked (that is, no overlap in a view where the heat dissipation vias 19 and the LED mounting area are projected onto a plane parallel to the ceramic layers), the degree of influence of the irregularities resulting from the formation of the heat dissipation vias 19 on the glass layer 22 can be further reduced. The layout of the heat dissipation vias 19 described above allows the magnitude of the irregularities to be sufficiently reduced as compared with a case where the heat dissipation vias 19 are disposed immediately below the area on which the LED 12 is mounted. When the heat dissipation vias 19 are disposed immediately below the area on which the LED 12 is mounted as in related art, it is necessary to make the second ceramic layer 11B thicker so as to reduce the magnitude of the irregularities on the front surface (that is, the element mounting surface) of the glass layer 22. This configuration, however, disadvantageously lowers the heat dissipation performance. In contrast, since the layout of the heat dissipation vias 19 in the wiring substrate 11 of the present embodiment also allows the magnitude of the irregularities on the front surface of the glass layer 22 to be reduced, the second ceramic layer 11B can be thinner and the heat dissipation performance can be improved accordingly. The thickness of the second ceramic layer 11B is desirably at least 50 µm from the viewpoint of reduction in the magnitude of the irregularities on the front surface of the glass layer 22 but smaller than or equal to 150 µm from the viewpoint of heat dissipation.

The front surface of the glass layer 22 may not be mirror-finished. For example, the glass layer 22 may have irregularities ranging from −5 to +5 μm on the front surface thereof. As long as the magnitude of the irregularities fall within the range described above, the amount of decrease in the die-bonding strength and the amount of shift of the optical axis of the LED 12 can be sufficiently small. Accepting surface roughness within this range allows the yield of the semiconductor light emitting device 10 to be improved.

A method for manufacturing the semiconductor light emitting device 10 according to the first embodiment will next be described in detail with reference to FIGS. 3 to 4.

Figure 3A:
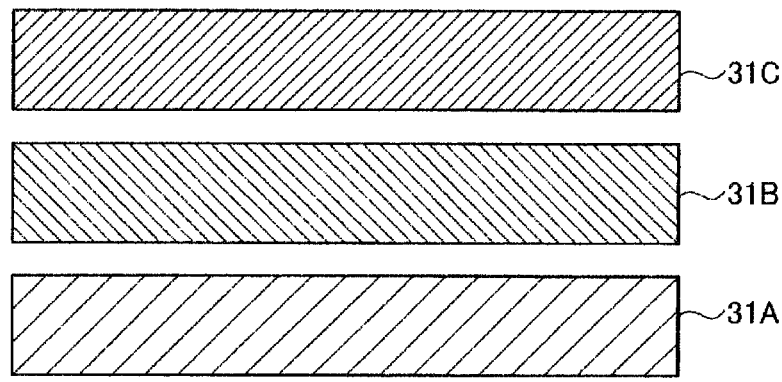
FIGS. 3A to 3C are cross-sectional views showing manufacturing steps in a method for manufacturing the semiconductor light emitting device according to the first embodiment of the invention.

First, three green sheets 31A, 31B, and 31C are produced (FIG. 3A). Specifically, ceramic powder and glass are first mixed at a fixed ratio therebetween. An organic binder and an organic solvent are subsequently added to the mixed raw material and allowed to diffuse until the mixture becomes uniform. A raw material of the green sheets is thus produced in the form of slurry. The slurry is then applied onto polyethylene terephthalate films (PET films) to a fixed thickness and dried in a film forming apparatus. The green sheets 31A, 31B, and 31C are thus produced. The green sheet 31A corresponds to the first ceramic layer 11A. The green sheet 31B corresponds to the second ceramic layer 11B. The green sheet 31C corresponds to the third ceramic layer 11C.

Figure 3B:
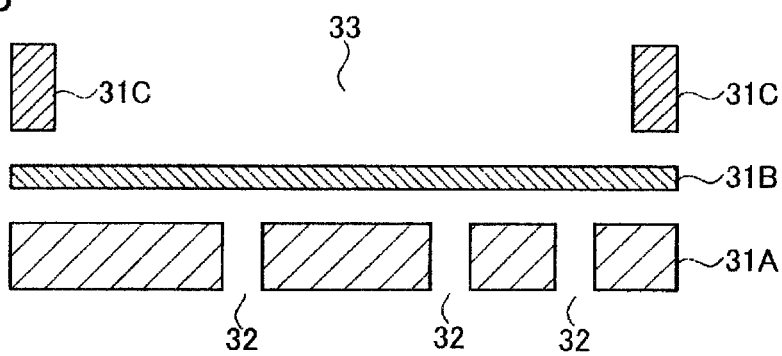

The green sheets 31A, 31B, and 31C are then cut into sheets having desired dimensions. Via holes 32 for forming the heat dissipation vias 19 and via holes for connecting the external connection terminals 18A and 18B to the wiring pads 15 are formed through the green sheet 31A. Further, via holes for connecting the external connection terminals 18A and 18B to the wiring pads 15 are formed through the green sheet 31B, as in the case of the green sheet 31A. A through hole 33 to be filled with the light transmissive resin 14 is formed through the green sheet 31C. FIG. 3B shows the green sheets 31A, 31B, and 31C having undergone the steps described above.

Figure 3C:
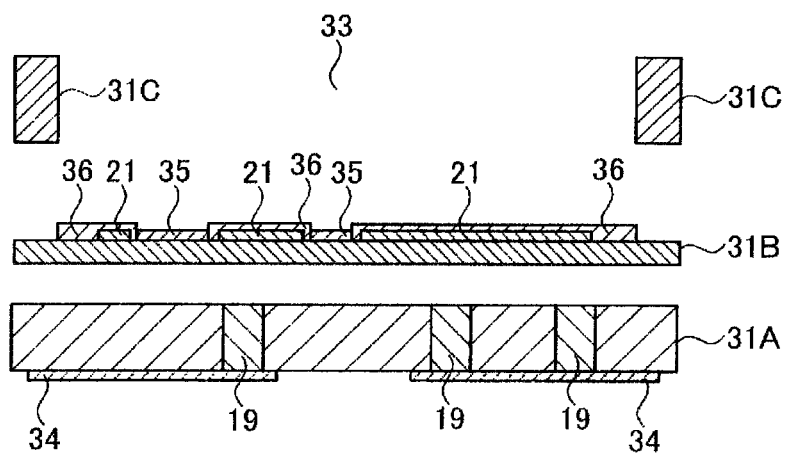

The via holes 32 and the other via holes are filled with AgPd to form the heat dissipation vias 19 and the internal wiring lines for connecting the external connection terminals 18A and 18B to the wiring pads 15. A terminal pattern 34 for forming the external connection terminals 18A and 18B is subsequently formed by printing AgPd on the rear surface of the green sheet 31A. Similarly, a wiring pad pattern 35 for forming the wiring pads 15 is formed by printing AgPd on the front surface of the green sheet 31B. The reflective layer 21 is then formed by printing Ag on the front surface of the green sheet 31B. Liquid glass 36 is subsequently applied onto the front surface of the green sheet 31B to cover the reflective layer 21. FIG. 3C shows the green sheets 31A, 31B, and 31C having undergone the steps described above.

Figure 4A:
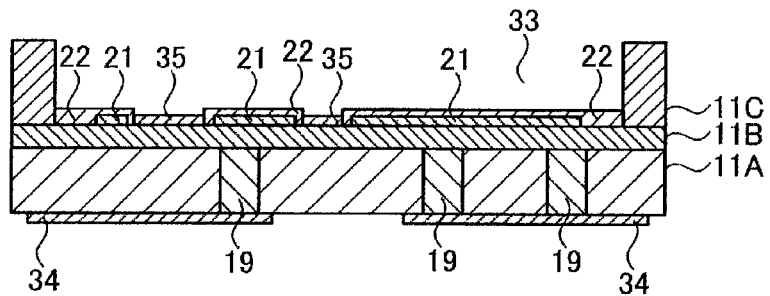
FIGS. 4A to 4D are cross-sectional views showing manufacturing steps in the method for manufacturing the semiconductor light emitting device according to the first embodiment of the invention.
Figure 4B:
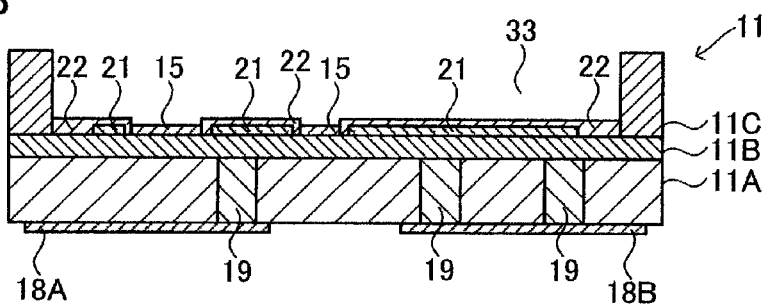

The green sheets 31A, 31B, and 31C are then stacked on each other in this order. The stacked green sheets 31A, 31B, and 31C are then sintered by pressurizing and heating them at approximately 900° C. The sintered green sheets become the first ceramic layer 11A, the second ceramic layer 11B, and the third ceramic layer 11C. The liquid glass solidifies in the heating process into the glass layer 22. FIG. 4A shows the resultant structure having undergone the steps described above.

Ni and Au are then deposited in this order on the terminal pattern 34 and the wiring pad pattern 35 by using known plating and sputtering techniques. The wiring pads 15 and the external connection terminals 18A and 18B are thus formed. After the deposition process, the patterns are separated into individual elements or wiring substrates. The wiring substrate 11 is formed by carrying out the steps described above (FIG. 4B).

Figure 4C:
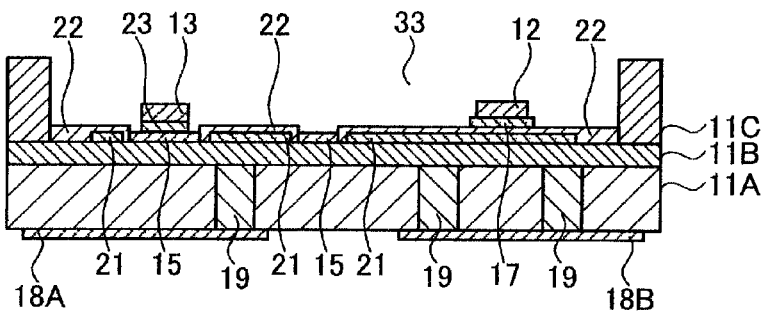
Figure 4D:
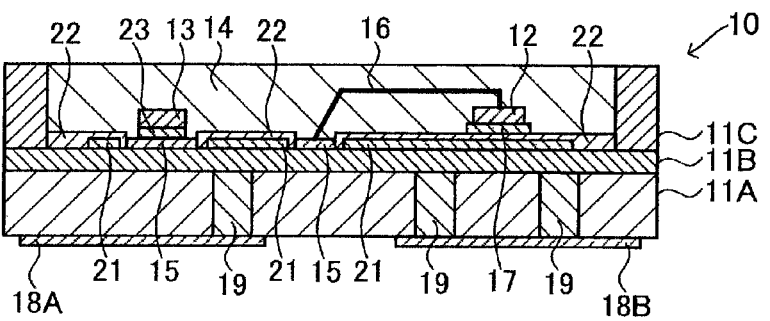

The silicone resin adhesive 17 is then applied onto the glass layer 22 in a desired position, and the conductive adhesive 23 is applied onto the desired wiring pad 15. Thereafter, the LED 12 is mounted on the silicone resin adhesive 17, and the protection element 13 is mounted on the conductive adhesive 23. FIG. 4C shows the state in which the LED 12 and the protection element 13 have been mounted.

Thereafter, the P-side and N-side electrodes of the LED 12 are electrically connected to the corresponding wiring pads 15 via bonding wires 16, and the P-side electrode of the protection element 13 is electrically connected to the corresponding wiring pad 15 via a bonding wire 16. The through hole 33 in the third ceramic layer 11C is then filled with the light transmissive resin 14. The semiconductor light emitting device 10 is formed by carrying out the steps described above (FIG. 4D).

As described above, in the semiconductor light emitting device 10 according to the invention, providing the heat dissipation vias 19 passing through only the first ceramic layer 11A and stacking the second ceramic layer 11B on the first ceramic layer 11A can prevent the irregularities produced on the front surface of the first ceramic layer 11A resulting from the formation of the heat dissipation vias 19 from affecting the element mounting surface of the second ceramic layer 11B. Since the heat dissipation vias 19 do not overlap with the element mounting area 20 of the second ceramic layer 11B in the direction in which the first ceramic layer 11A and the second ceramic layer 11B are stacked, the degree of influence of the irregularities on the element mounting surface can be further reduced. Moreover, providing the heat dissipation vias 19 in positions other than the portion immediately below the LED 12 allows the second ceramic layer 11B to be thinner, whereby the heat dissipation performance of the semiconductor light emitting device 10 can be improved.

Further, reducing the magnitude of the irregularities described above can prevent the die-bonding strength of the LED 12 from decreasing and the optical axis of the LED 12 from shifting.

Second Embodiment

In the first embodiment, the wiring pads 15 are formed on the second ceramic layer 11B. Alternatively, the wiring pads 15 may be formed on the first ceramic layer 11A. The positions where the wiring pads 15 are formed are thus changed in a second embodiment, which will be described with reference to FIGS. 5A to 5C. The same portions as those in the first embodiment have the same reference numerals, and only the portions different from those in the first embodiment will be described.

Figure 5A:
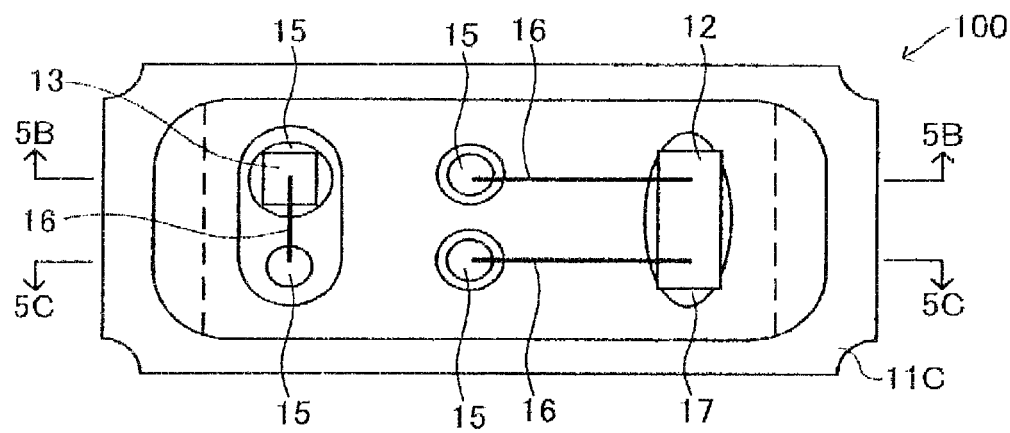
FIG. 5A is a plan view showing a semiconductor light emitting device according to a second embodiment of the invention.
Figure 5B:
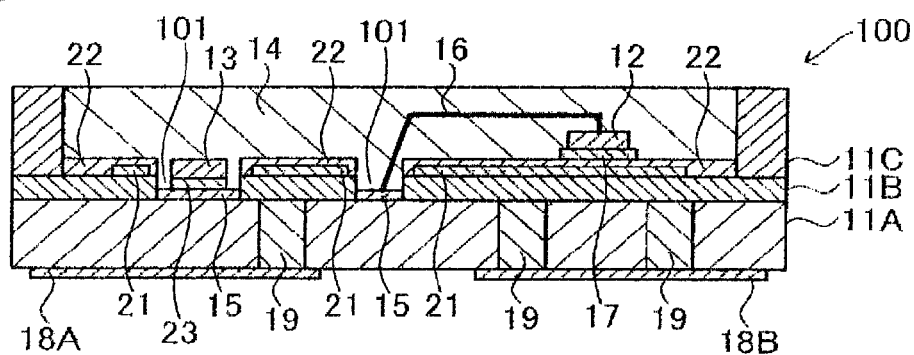
FIG. 5B is a cross-sectional view taken along the line 5B-5B in FIG. 5A.
Figure 5C:
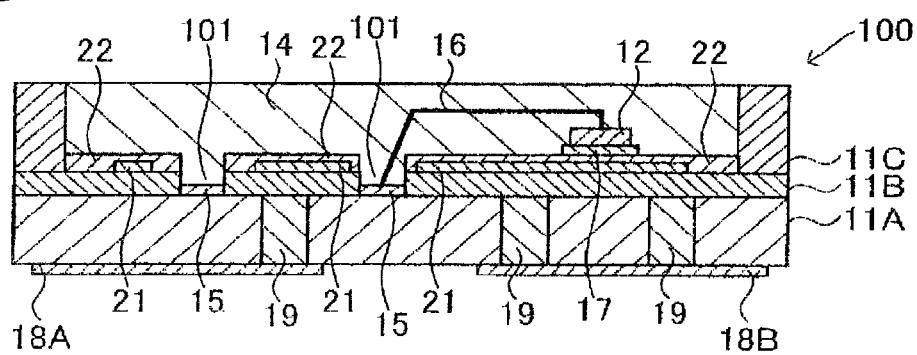
FIG. 5C is a cross-sectional view taken along the line 5C-5C in FIG. 5A.

FIG. 5A is a plan view of a semiconductor light emitting device 100 according to the second embodiment of the invention. FIG. 5B is a cross-sectional view taken along the line 5B-5B in FIG. 5A. FIG. 5C is a cross-sectional view taken along the line 5C-5C in FIG. 5A.

A through hole 101 is formed through the second ceramic layer 11B, as shown in FIGS. 5A to 5C. The wiring pads 15 are formed on the first ceramic layer 11A exposed through the through hole 101. Employing the configuration described above increases the difference in height between the LED 12 and the wiring pads 15 in the direction in which the ceramic layers are stacked as compared with the difference in the first embodiment, and hence reduces the possibility of the light emitted from the LED 12 reaching the wiring pads 15. Since the wiring pads 15 having Au formed thereon have lower light reflectance, reducing the amount of light that reaches the wiring pads 15 allows the semiconductor light emitting device 100 itself to emit light of higher intensity.

No description will be made of a method for manufacturing the semiconductor light emitting device 100 because the manufacturing method differs from that in the first embodiment only in that the through hole 101 is formed through the green sheet 31B.

Third Embodiment

The first and second embodiments have been described with reference to a semiconductor light emitting device having a single LED mounted therein. Alternatively, a plurality of LEDs may be mounted on the wiring substrate. A multichip-type semiconductor light emitting device in which a plurality of LEDs are mounted on the wiring substrate will be described below.

Figure 6A:
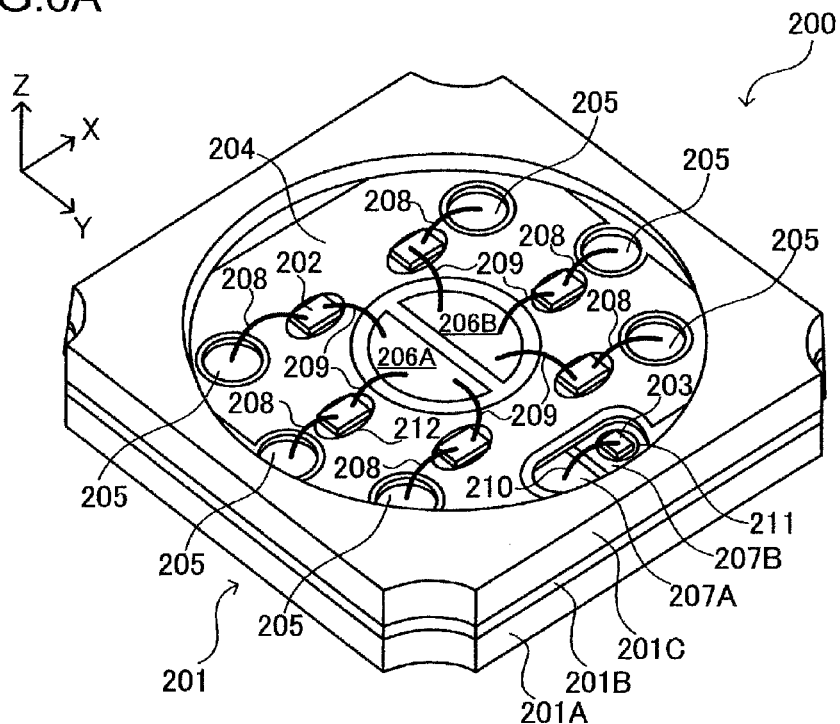
FIG. 6A is a perspective view showing a semiconductor light emitting device according to a third embodiment of the invention.
Figure 6B:
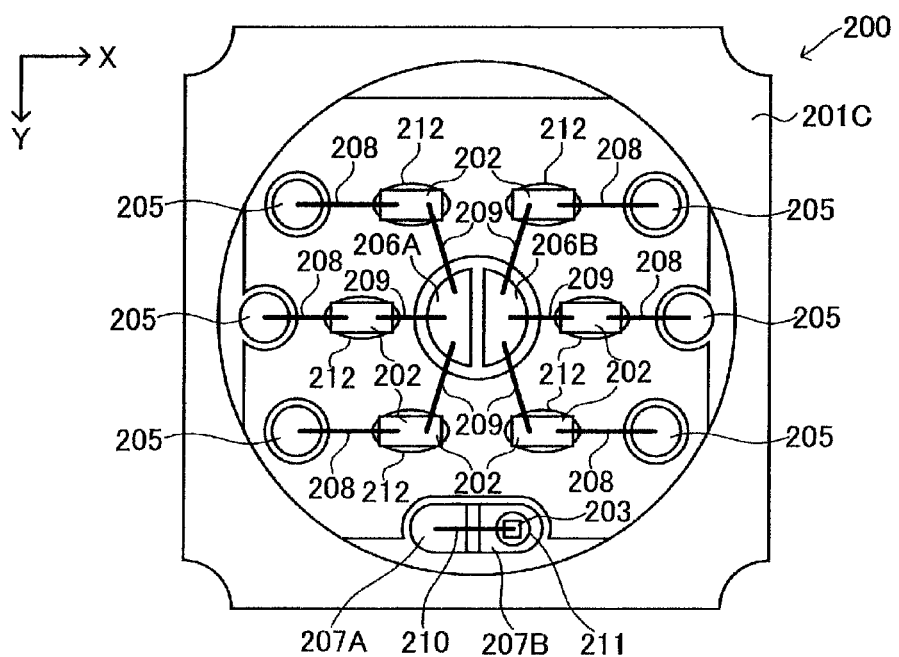
FIG. 6B is a plan view showing the semiconductor light emitting device according to the third embodiment of the invention.
Figure 7A:
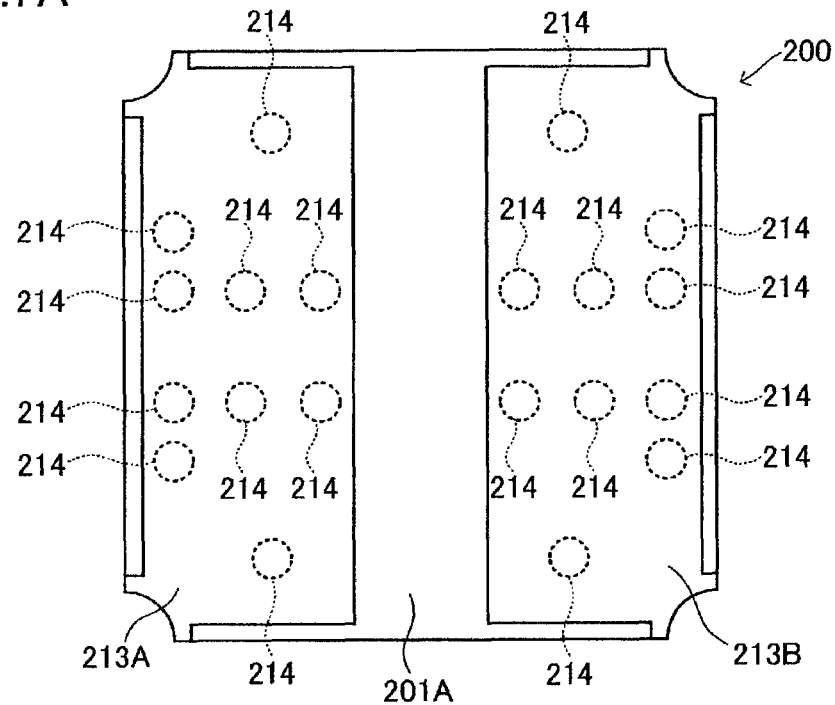
FIG. 7A is a bottom view showing the semiconductor light emitting device according to the third embodiment of the invention.
Figure 7B:
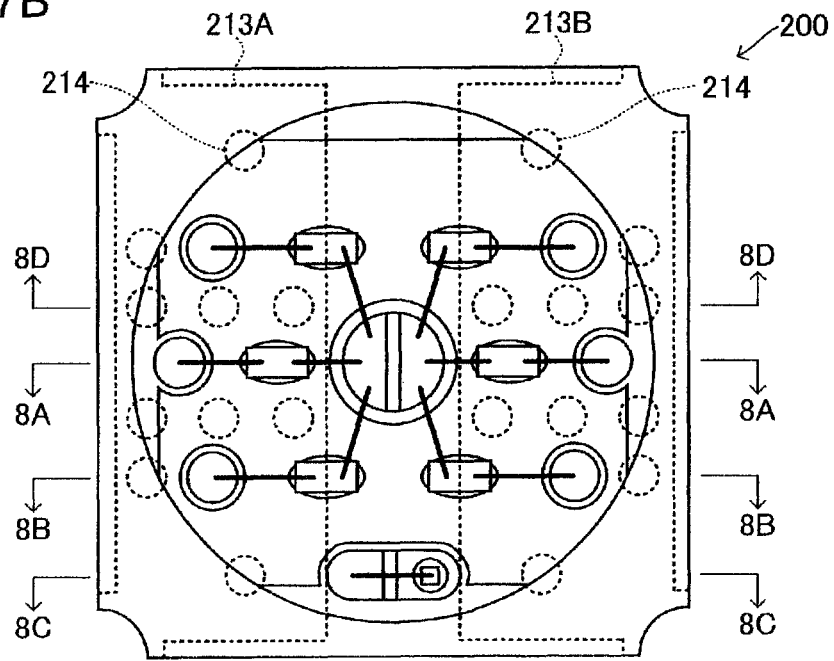
FIG. 7B is a schematic plan view illustrating the positions of heat dissipation vias in the semiconductor light emitting device according to the third embodiment.
Figure 8A:
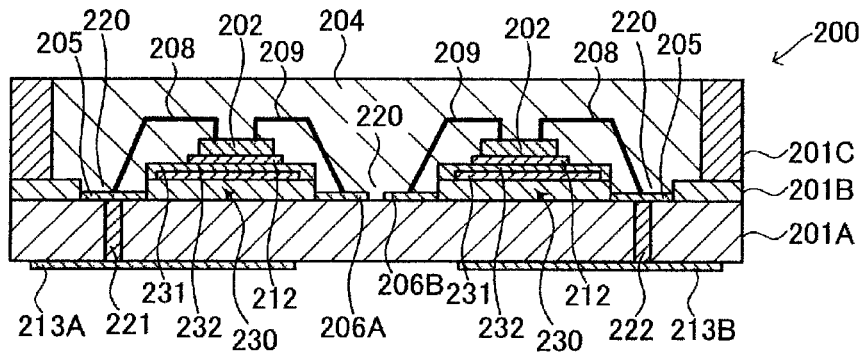
FIG. 8A is a cross-sectional view taken along the line 8A-8A in FIG. 7B.
Figure 8B:
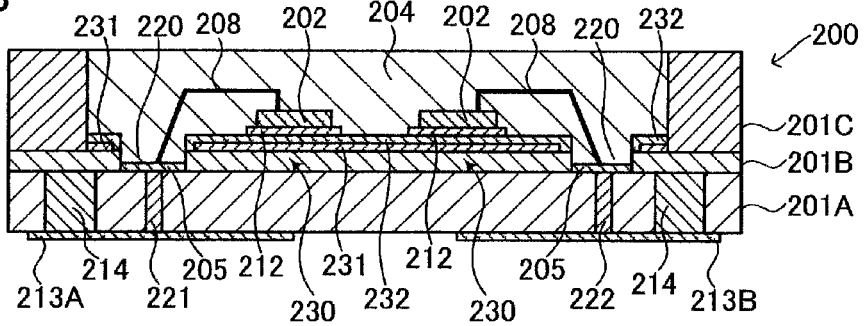
FIG. 8B is a cross-sectional view taken along the line 8B-8B in FIG. 7B.
Figure 8C:
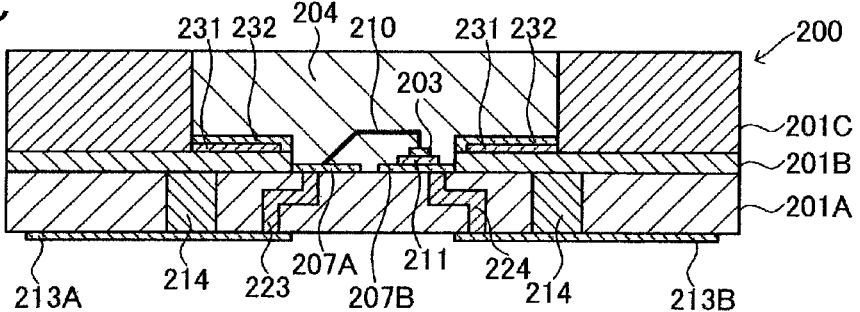
FIG. 8C is a cross-sectional view taken along the line 8C-8C in FIG. 7B.
Figure 8D:
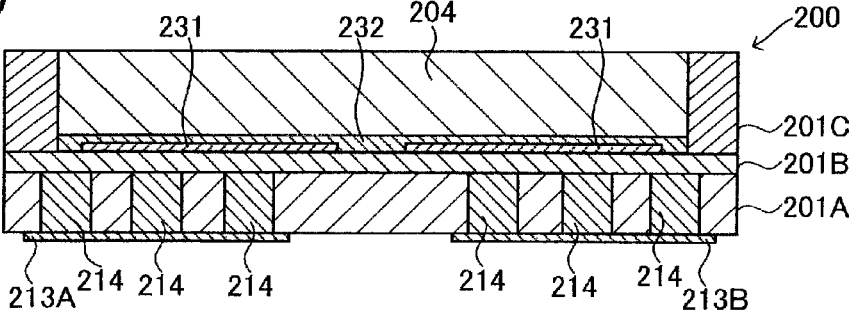
FIG. 8D is a cross-sectional view taken along the line 8D-8D in FIG. 7B.
Figure 9:
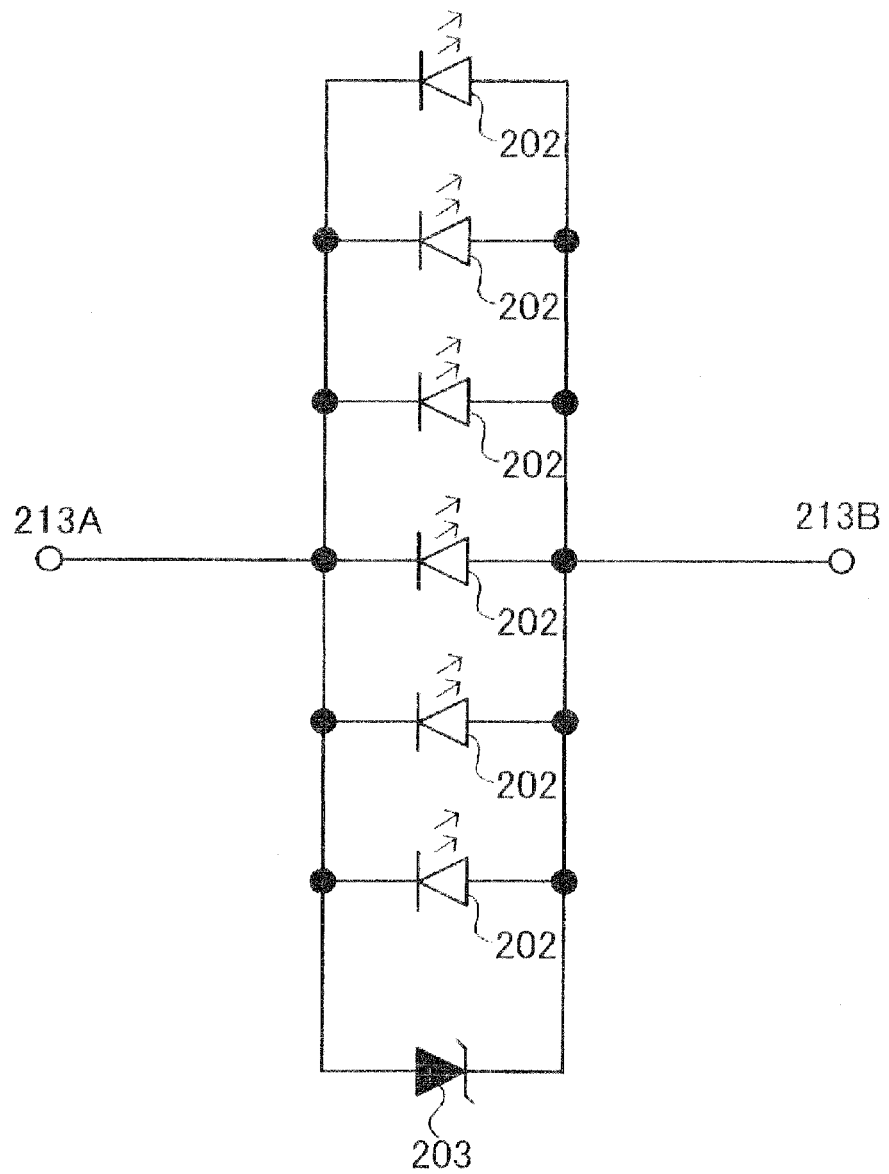
FIG. 9 is an equivalent circuit diagram of the semiconductor light emitting device according to the third embodiment of the invention.

The structure of a semiconductor light emitting device according to a third embodiment will first be described with reference to FIGS. 6 to 9. FIG. 6A is a perspective view of the semiconductor light emitting device according to the third embodiment. FIG. 6B is a plan view of the semiconductor light emitting device. FIG. 7A is a bottom view of the semiconductor light emitting device. FIG. 7B is a schematic plan view for illustrating the positions of heat dissipation vias in the semiconductor light emitting device according to the third embodiment. FIG. 8A is a cross-sectional view taken along the line 8A-8A in FIG. 7B. FIG. 8B is a cross-sectional view taken along the line 8B-8B in FIG. 7B. FIG. 8C is a cross-sectional view taken along the line 8C-8C in FIG. 7B. FIG. 8D is a cross-sectional view taken along the line 8D-8D in FIG. 7B. FIG. 9 is an equivalent circuit diagram of the semiconductor light emitting device according to the third embodiment.

A semiconductor light emitting device 200 includes a square-shape wiring substrate 201, six LEDs 202 and one protection element 203 mounted on the wiring substrate 201, and a light transmissive resin 204 that covers the LEDs 202 and the protection element 203, as shown in FIGS. 6A and 6B. Each of the LEDs 202 has a substantially rectangular shape when viewed from above, and the protection element 203 has a substantially square shape when viewed from above. Now, let an X-axis be the direction along the major or longer side of each of the LEDs 202, a Y-axis be the direction along the minor side of each of the LEDs 202, and a Z-axis be the thickness direction of the wiring substrate 201, as shown in FIGS. 6A and 6B.

The wiring substrate 201 is made of a low temperature co-fired ceramic (LTCC) containing $Al_2O_3$ as a primary component. Specifically, the wiring substrate 201 includes a first ceramic layer 201A that functions as a support, a second ceramic layer 201B provided on the first ceramic layer 201A and having an element mounting area, and a third ceramic layer 201C provided on the second ceramic layer 201B and functioning as not only a reflector that reflects light from the LEDs 202 but also a sidewall that prevents the light transmissive resin 204 from leaking. The second ceramic layer 201B is thinner than the first ceramic layer 201A. The wiring substrate 201 is so sized to be approximately 5 mm in the X-axis direction, approximately 5 mm in the Y-axis direction, and approximately 1 mm in the Z-axis direction.

Six circular wiring pads 205, two semicircular wiring pads 206A and 206B, and wiring pads 207A and 207B for the protection element 203 are formed on the front surface of the second ceramic layer 201B. Each of the wiring pads 205, 206A, 206B, 207A, and 207B is a metallic pad made of AgPd, Ni, and Au stacked in this order (AgPd/Ni/Au). Each of the wiring pads 205 is connected to a P-side electrode or an N-side electrode of the corresponding LED 202 via a bonding wire 208. More specifically, the wiring pads 205 connected to the LEDs 202 mounted in positions shifted or displaced in the −X direction from the center of the semiconductor light emitting device 200 are connected to the N-side electrodes of the LED 202, and the wiring pads 205 connected to the LEDs 202 mounted in positions displaced in the +X direction from the center of the semiconductor light emitting device 200 are connected to the P-side electrodes of the LED 202. The wiring pad 206A is connected to the P-side electrodes of the LEDs 202 on the −X side via bonding wires 209, and the wiring pad 206B is connected to the N-side electrodes of the LEDs 202 on the +X side via bonding wires 209. The reason why the wiring configuration described above is employed is that the LEDs 202 mounted on the wiring substrate 201 are all oriented in the same direction. The wiring pad 207A is connected to a P-side electrode of the protection element 203 via a bonding wire 210. The protection element 203 is mounted on the wiring pad 207B via a conductive adhesive 211. In other words, an N-side electrode provided on the rear surface of the protection element 203 is electrically connected to the wiring pad 207B via the conductive adhesive 211. Each of the LEDs 202 is fixedly attached to the front surface of the second ceramic layer 201B via a silicone resin adhesive 212. In the present embodiment, the areas of the second ceramic layer 201B to which the LEDs 202 are fixedly attached are called element mounting areas 230. The silicone resin adhesive 212 has a thickness ranging from 10 to 30 μm (approximately 20 μm, for example).

The third ceramic layer 201C has a circular through hole formed therethrough, and the LEDs 202, the protection element 203, the wiring pads 205, 206A, 206B, 207A, and 207B, and the bonding wires 208, 209, and 210 are disposed on the front surface of the second ceramic layer 201B that is exposed through the through hole. Further, the light transmissive resin 204 is so provided on the front surface of the second ceramic layer 201B that the LEDs 202, the protection element 203, the wiring pads 205, 206A, 206B, 207A, and 207B, and the bonding wires 208, 209, and 210 are covered and the through hole is filled.

External connection terminals 213A and 213B are formed on the rear surface of the first ceramic layer 201A, as shown in FIG. 7A. Each of the external connection terminals 213A and 213B is a metallic terminal made of AgPd, Ni, and Au stacked in this order (i.e., AgPd/Ni/Au). A plurality of heat dissipation vias 214 extending in the thickness direction (i.e., Z-axis direction) of the first ceramic layer 201A are formed in the areas where the external connection terminals 213A and 213B are formed. The heat dissipation vias 214 are formed as shown in FIG. 7B. Specifically, some are disposed between the areas where the LEDs 202 are mounted. Some are disposed between the areas where the LEDs 202 are mounted and the areas where the wiring pads 205 are formed. The others are disposed so as to surround the portions where the wiring pads 205 are formed. In other words, the heat dissipation vias 213 are formed in positions shifted or displaced from those immediately below the areas where the LEDs 202, the protection element 203, and the wiring pads 205, 206A, 206B, 207A, and 207B are mounted.

The heat dissipation vias 214, each of which has a substantially cylindrical shape, are buried in the first ceramic layer 201A, as shown in FIGS. 8B to 8D. In other words, the heat dissipation vias 214 do not pass through the second ceramic layer 201B. Further, one end of each of the heat dissipation vias 214 is connected to the external connection terminal 213A or 213B. The heat dissipation vias 214, which are made of AgPd, are superior in heat dissipation performance to the first ceramic layer 201A.

The second ceramic layer 201B has a plurality of through holes 220 formed therethrough, as shown in FIGS. 8A to 8C. The wiring pads 205, 206A, 206B, 207A, and 207B are formed in the areas of the first ceramic layer 201A that are exposed through the through holes 220.

The wiring pads 205 connected via bonding wires 208 to the N-side electrodes of the LEDs 202 mounted in positions displaced in the −X direction from the center of the semiconductor light emitting device 200 are connected to the external connection terminal 213A via internal wiring lines 221 formed in the first ceramic layer 201A, as shown in FIGS. 8A and 8B. On the other hand, the wiring pad 206A connected via bonding wires 209 to the P-side electrodes of the LEDs 202 mounted in positions displaced in the −X direction from the center of the semiconductor light emitting device 200 is connected to the external connection terminal 213B via an internal wiring line (not shown) formed in the first ceramic layer 201A. The wiring pads 205 connected via bonding wires 208 to the P-side electrodes of the LEDs 202 mounted in positions displaced in the +X direction from the center of the semiconductor light emitting device 200 are connected to the external connection terminal 213B via internal wiring lines 222 formed in the first ceramic layer 201A. On the other hand, the wiring pad 206B connected via bonding wires 209 to the N-side electrodes of the LEDs 202 mounted in positions displaced in the +X direction from the center of the semiconductor light emitting device 200 is connected to the external connection terminal 213A via an internal wiring line (not shown) formed in the first ceramic layer 201A. The internal wiring lines 221, 222, 223, and 224 formed in the first ceramic layer 201A are made of AgPd. The internal wiring lines that are not shown are also made of AgPd.

A reflective layer 231 and a glass layer 232 are further formed on the front surface of the second ceramic layer 201B, as shown in FIGS. 8A to 8D. The reflective layer 231, which is made of Ag, reflects the light emitted from the LEDs 202 toward a light extracting plane. The reflective layer 231 has a thickness ranging from approximately 5 to 15 µm. The reflective layer 231 is desirably formed substantially all over the front surface of the second ceramic layer 201B. The glass layer 232 serves as a protective layer that covers the upper and side surfaces of the reflective layer 231 so that the reflective layer 231 is not exposed to the atmosphere and prevents the reflective layer 231 made of Ag from being sulfurized. The glass layer 232 has a thickness ranging from 15 to 25 µm (approximately 20 µm, for example). The reflective layer 231 and the glass layer 232, which is a protective layer, are formed at least on the element mounting area 230 of the second ceramic layer 201B, and each of the LEDs 202 is disposed on the element mounting area 230 via the reflective layer 231, the glass layer 232, and the silicone resin adhesive 212.

The protection element 203 is fixedly attached to the wiring pad 207B with the conductive adhesive 211, as shown in FIG. 8C. The wiring pad 207B electrically connected to the protection element 203 via the conductive adhesive 211 is connected to the external connection terminal 213A via an internal wiring line 223 formed in the first ceramic layer 201A. The wiring pad 207A electrically connected to the P-side electrode of the protection element 203 via the bonding wire 210 is connected to the external connection terminals 213B via an internal wiring line 224 formed in the first ceramic layer 201A.

The six LEDs 202 are connected in parallel with one another, and the protection element 203 is connected in parallel with the LEDs 202, as shown in FIG. 9. The circuit configuration allows the protection element 203 to absorb any surge voltage applied between the external connection terminals 213A and 213B and hence prevents the LEDs 202 from being destroyed or degraded.

A description will next be made of an advantageous effect of the semiconductor light emitting device 200 and the wiring substrate 201 according to the third embodiment. In the wiring substrate 201 according to the third embodiment, the light emitted from the LEDs 202 can be directed toward the light extracting plane since the reflective layer 231 made of Ag is formed on the front surface of the ceramic layer 201B, whereby the intensity of the light from the semiconductor light emitting device 200 can be increased. Further, covering the reflective layer 231 with the glass layer 232 prevents the Ag of which the reflective layer 231 is made from being sulfurized and the Ag from diffusing into the light transmissive resin 204. It is therefore possible to prevent the intensity of the light from the semiconductor light emitting device 200 from decreasing with time.

Further, in the wiring substrate 201 according to the third embodiment, the heat generated in association with the light emission in the LEDs 202 can be efficiently dissipated out of the semiconductor light emitting device 200, since a plurality of heat dissipation vias 214 are buried in the first ceramic layer 201A in the vicinity of the areas on which the LEDs 202 are mounted.

Further, in the wiring substrate 201 according to the third embodiment, the degree of influence of the irregularities resulting from the formation of the heat dissipation vias 214 on the glass layer 232 can be reduced, since the reflective layer 231 and the glass layer 232 are formed via the second ceramic layer 201B above the first ceramic layer 201A, in which the heat dissipation vias 214 are buried. In other words, the interposed second ceramic layer 201B reduces the magnitude of the irregularities on the front surface of the glass layer 232 and hence the element mounting surfaces remain flat. Accordingly, the die-bonding strength of the LEDs 202 can be prevented from decreasing. Further, since the heat dissipation vias 214 are so buried that they do not overlap with the areas on which the LEDs 202 are mounted in the direction in which the layers of the wiring substrate 201 are stacked, the degree of influence of the irregularities resulting from the formation of the heat dissipation vias 214 on the glass layer 232 can be further reduced. The layout of the heat dissipation vias 214 allows the magnitude of the irregularities to be sufficiently reduced as compared with a case where the heat dissipation vias 214 are disposed immediately below the areas on which the LEDs 202 are mounted. When the heat dissipation vias 214 are disposed immediately below the areas on which the LEDs 202 are mounted as in related art, it is necessary to make the second ceramic layer 201B thicker so as to reduce the magnitude of the irregularities on the front surface (that is, the element mounting surfaces) of the glass layer 232. This configuration, however, disadvantageously lowers the heat dissipation performance. In contrast, since the layout of the heat dissipation vias 214 in the wiring substrate 201 of the present embodiment also allows the magnitude of the irregularities on the front surface of the glass layer 232 to be reduced, the second ceramic layer 201B can be thinner and the heat dissipation performance can be improved accordingly. The thickness of the second ceramic layer 201B is desirably at least 50 µm from the viewpoint of reduction in the magnitude of the irregularities on the front surface of the glass layer 232 but smaller than or equal to 150 μm from the viewpoint of heat dissipation.

The front surface of the glass layer 232 may not be mirror-finished. For example, the glass layer 232 may have irregularities ranging from −5 to +5 μm on the front surface thereof. As long as the magnitude of the irregularities falls within the range described above, the amount of decrease in the die-bonding strength and the amount of shift of the optical axes of the LEDs 202 can be sufficiently small. Accepting surface roughness within this range allows the yield of the semiconductor light emitting device 200 to be improved.

Further, in the semiconductor light emitting device 200 according to the third embodiment, since the heat dissipation vias are disposed symmetrically with respect to the center of the semiconductor light emitting device 200, the irregularities on the front surface of the glass layer 232 are distributed uniformly thereacross, whereby variation in the optical axes of the LEDs 202 can be reduced. When the six LEDs 202 are formed of red LEDs, green LEDs, and blue LEDs, it is possible to reduce the degree of degradation in intensity balance among RGB colors (R: red, G: green, and B: blue) of the light from the semiconductor light emitting device 200. Further, since the heat dissipation vias 214 are disposed symmetrically with respect to the center of the first ceramic layer 201A (that is, the semiconductor light emitting device 200), the degree of unevenly distributed warpage of the substrate due to thermal expansion or thermal shrinkage can be reduced.

Further, the through holes 220 are formed through the second ceramic layer 201B, and the wiring pads 205, 206A, 206B, 207A, and 207B are formed on the portions of the first ceramic layer 201A that are exposed through the through holes 220, as described above. Employing the configuration described above increases the difference in height between the LEDs 202 and the wiring pads 205, 206A, 206B, 207A, and 207B in the direction in which the ceramic layers are stacked (Z-axis direction) as compared with the difference in the first embodiment and hence reduces the possibility of the light emitted from the LEDs 202 reaching the wiring pads 205, 206A, 206B, 207A, and 207B. Since the LEDs 202 and the wiring pads 205, 206A, 206B, 207A, and 207B having Au formed thereon have lower light reflectance, reducing the amount of light that reaches the LEDs 202 and the wiring pads 205, 206A, 206B, 207A, and 207B allows the semiconductor light emitting device 200 itself to emit light of higher intensity.

No description will be made of a method for manufacturing the semiconductor light emitting device 200 because the manufacturing method differs from that in the first embodiment only in terms of the shapes of the green sheets 31A, 31B, and 31C, the positions of the heat dissipation vias 214, the topology of the wiring lines, and the number of LEDs 202 but the basic manufacturing steps are the same.

The wiring pads 205, 206A, 206B, 207A, and 207B formed on the first ceramic layer 201A in the third embodiment may alternatively be formed on the second ceramic layer 201B, as in the first embodiment.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2010-114319 which is hereby incorporated by reference.

What is claimed is:

1. A semiconductor light emitting device comprising:
a first ceramic layer;
a second ceramic layer which is stacked on said first ceramic layer and has an element mounting area;
a reflective layer which is formed on a surface of said second ceramic layer such that said reflective layer covers at least said element mounting area;
a protective layer which covers said reflective layer;
a semiconductor light emitting element which is mounted on said protective layer and positioned above said element mounting area;
at least one heat dissipation via which passes through only said first ceramic layer; and
an internal wiring line formed in the first ceramic layer, said internal wiring line connecting said semiconductor light emitting element to an external connection terminal,
wherein said first ceramic layer has a region that overlaps with an entirety of said element mounting area in a direction in which said first and second ceramic layers are stacked, and wherein said region of said first ceramic layer is devoid of any heat dissipation via;
wherein no heat dissipation via passes through any portion of said second ceramic layer.

2. The semiconductor light emitting device according to claim 1, wherein said at least one heat dissipation via comprises a plurality of heat dissipation vias, and wherein said heat dissipation vias are disposed so as to sandwich a corresponding portion immediately below said element mounting area.

3. The semiconductor light emitting device according to claim 1, wherein said at least one heat dissipation via comprises a plurality of heat dissipation vias, and wherein said heat dissipation vias are disposed so as to surround a corresponding portion immediately below said element mounting area.

4. The semiconductor light emitting device according to claim 1, wherein said at least one heat dissipation via comprises a plurality of heat dissipation vias, and wherein said heat dissipation vias are disposed symmetrically with respect to a center of said first ceramic layer.

5. The semiconductor light emitting device according to claim 1, wherein said second ceramic layer has a thickness ranging from 50 to 150 micrometers.

6. The semiconductor light emitting device according to claim 1, wherein said protective layer has irregularities with a size of not more than 5 micrometers formed on a surface of said protective layer.

7. The semiconductor light emitting device according to claim 1, wherein a through hole is formed through said second ceramic layer, and a wiring pad formed on said first ceramic layer is exposed through said through hole.

* * * * *